United States Patent [19]

Miyake

[11] Patent Number: 5,399,990
[45] Date of Patent: Mar. 21, 1995

[54] DIFFERENTIAL AMPLIFIER CIRCUIT HAVING REDUCED POWER SUPPLY VOLTAGE

[75] Inventor: Hideki Miyake, Itami, Japan

[73] Assignee: Mitsubishi Denki Kabushiki Kaisha, Tokyo, Japan

[21] Appl. No.: 194,346

[22] Filed: Feb. 8, 1994

[30] Foreign Application Priority Data

Feb. 19, 1993 [JP] Japan .................................. 5-030290

[51] Int. Cl.$^6$ .............................................. H03F 3/45
[52] U.S. Cl. ...................................... 330/254; 330/257; 330/261
[58] Field of Search ................. 330/252, 254, 257, 261

[56] References Cited

U.S. PATENT DOCUMENTS

5,006,818  4/1991  Kuyama et al. .................... 330/261

Primary Examiner—James B. Mullins
Attorney, Agent, or Firm—Oblon, Spivak, McClelland, Maier & Neustadt

[57] ABSTRACT

A variable gain amplifier circuit includes four transistors. The pair of first and third transistors and the other pair of second and fourth transistors are provided with signals ($V_A$, $V_C$) and ($V_B$, $B_D$), respectively, which are obtained through application of the first and second biases to the differential input signals. Then, both pairs perform a differential operation in response to the respective signals applied thereto. On the other hand, in the pair of first and second transistors and the other pair of third and fourth transistors, each pair divides a current which is provided thereto between respective transistors. Differential output signals can be obtained from the pair of second and fourth transistors, and a gain thereof can be controlled according to the current flowing through the first and third transistors. As compared with the prior art, the number of transistors which are connected in series is reduced by one, so that signals to be processed becomes larger by a collector-emitter saturation voltage of the transistor.

20 Claims, 6 Drawing Sheets

DIFFERENTIAL AMPLIFIER CIRCUIT HAVING REDUCED POWER SUPPLY VOLTAGE

BACKGROUND OF THE INVENTION

The present invention relates to a differential amplifier employed in a semiconductor integrated circuit, and more particularly to a differential amplifier whose gain is variable.

1. Field of the Invention
2. Description of the Background Art

Figure 6:
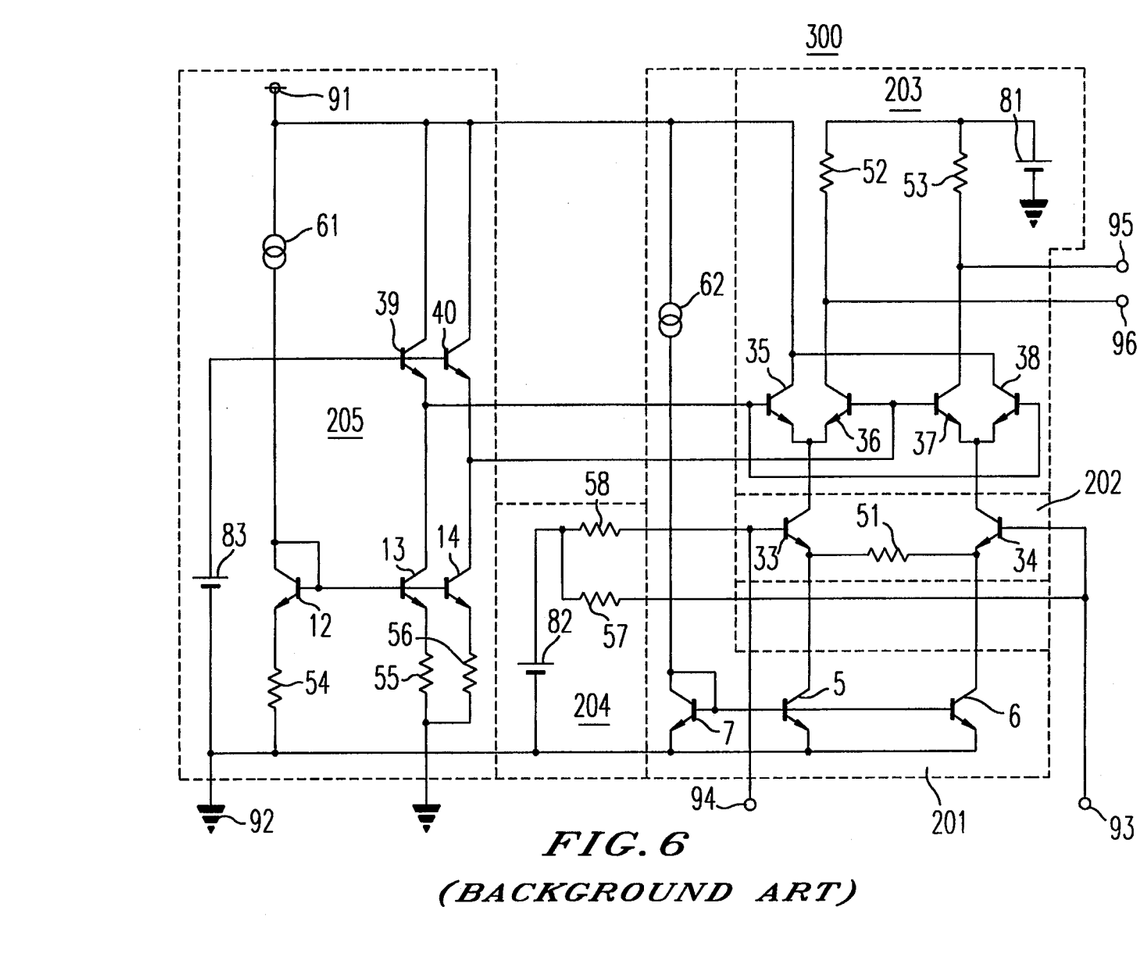
FIG. 6 is a circuit diagram showing a the prior art.

FIG. 6 is a circuit diagram showing a conventional variable gain amplifier 300. A differential input unit 202 which is connected to differential input terminals 93 and 94 receives differential input signals. The differential input unit 202 is provided with a constant current by a current supply unit 201 and on the basis of the constant current, outputs two currents (hereinafter referred to as "differential current") in response to the differential input signals (hereinafter the operation of outputting the two currents in response to the differential input signals is referred to as "differential operation"). A gain control unit 203 amplifies the two differential currents at a predetermined gain (also may be a case where the gain is under 1, i.e., a case of substantial attenuation, and the same applies hereinafter) and outputs differential output signals to differential output terminals 95 and 96.

The differential input unit 202 is connected to an input bias unit 204 which determines a bias to be applied to the differential input signal. The gain control unit 203 is connected to a gain bias unit 205 which determines two different bias potentials to control gains of the gain control unit 203.

The differential input unit 202 consists of transistors 33, 34 and a resistor 51. The differential input signals are applied to bases of the transistors 33 and 34, and thereafter two differential currents flow into collectors thereof.

The gain control unit 203 comprises two pairs of transistors 35, 36 and transistors 37, 38. Two emitters of each pair of transistors are connected to the same transistor in common. The former pair receives a differential current from a collector of the transistor 33 and the latter receives another differential current from a collector of the transistor 34.

Bases of the transistors 35 and 38 are connected in common and receive one of the two different bias potentials from the gain bias unit 205. Bases of the transistors 36 and 37 are also connected in common and receive the other of the two different bias potentials. Collectors of the transistors 36 and 37 are connected to a voltage source 81 through resistors 52 and 53, respectively and the differential output signals are drawn out of the collectors of these transistors.

The gain of the variable gain amplifier is determined depending on the ratios of currents in the resistors 52 and 53 to collector currents of the transistors 33 and 34, respectively. The ratio is controlled by varying the collector currents of the transistors 35 to 38. Further, the collector currents of the transistors 35 to 38 are controlled according to the two different bias potentials which are provided by the gain bias unit 205.

The gain bias unit 205 comprises transistors 12 to 14, 39 and 40. The transistors 39, 13 and the resistor 55, and the transistors 40, 14 and the resistor 56 are connected in series, respectively. The transistor 12 is connected to the resistor 54 and a current source 61 in series. Along with the transistors 13, 14 and the resistors 55, 56, the transistor 12 provides a constant current to the transistors 39 and 40. The bases of the transistors 39 and 40 are connected to a voltage source 83 and two different bias potentials are drawn out of the emitters thereof.

Assuming now that base-emitter voltages of the transistors 35, 36, 39 and are $V_{35}$, $V_{36}$, $V_{39}$ and $V_{40}$, collector currents of the transistors 35 and 36 are $I_{35}$ and $I_{36}$ and emitter currents of the transistors 39 and 40 are $I_{39}$ and $I_{40}$, respectively, they are expressed as follows:

$$V_{35} = K \ln \frac{I_{35}}{I_0}, \tag{1}$$

$$V_{36} = K \ln \frac{I_{36}}{I_0},$$

$$V_{39} = K \ln \frac{I_{39}}{I_0},$$

$$V_{40} = K \ln \frac{I_{40}}{I_0}$$

wherein K and $I_0$ are constants.

From FIG. 6, the following can be seen:

$$V_{36} - V_{35} = V_{39} - V_{40} \tag{2}$$

Then, the following expressions can be deduced from Formulae 1 and 2:

$$K \ln \left( \frac{I_{36}/I_0}{I_{35}/I_0} \right) = K \ln \left( \frac{I_{39}/I_0}{I_{40}/I_0} \right) \tag{3}$$

$$\frac{I_{36}}{I_{35}} = \frac{I_{39}}{I_{40}}$$

Accordingly, the currents can be expressed as follows:

$$\frac{I_{36}}{I_{35} + I_{36}} = \frac{I_{39}}{I_{39} + I_{40}} \tag{4}$$

Therefore, the ratio of the current in the resistor 52 out of the collector current of the transistor 33 is $I_{39}/(I_{39}+I_{40})$. Similarly, the ratio of the current in the resistor 53 out of the collector current of the transistor 34 is also $I_{39}/(I_{39}+I_{40})$, and these ratios are equal to each other. Ignoring the base currents of the transistors 35 to 38, the emitter currents $I_{39}$ and $I_{40}$ of the transistors 39 and 40 can be set from zero to an arbitrary amount by selecting appropriate resistance values of the resistors 55 and 56.

When the emitter currents $I_{39}$ and $I_{40}$ are set so that the collector current of the transistor 33 may entirely flow into the resistor 52, the ratio of an amplitude $V_o$ of the differential output signal to be outputted between the differential output terminals 95 and 96 to an amplitude $V_i$ of the differential input signal to be provided between the differential input terminals 93 and 94, i.e., a gain $G_{max}$ may be expressed as follows;

$$G_{max} = \frac{R_L}{R_E/2 + r_e} \tag{5}$$

where $R_E$, $R_L$ and $r_e$ are resistance values of the resistors 51, 52 and the emitter resistance of each transistor, respectively. Accordingly, the gain G of the variable gain amplifier can be deduced from Formulae 4 and 5 as follows:

$$G = \frac{I_{39}}{I_{39} + I_{40}} \cdot \frac{R_L}{R_E/2 + r_e} \tag{6}$$

That is, a variable range of the gain in the amplifier is $0 \sim R_L/(R_E/2+r_e)$, ignoring the base currents of the transistors 35 to 38.

A potential $V_{81}$ provided by the voltage source 81 which is equipped in the gain control unit 203 should be over a certain minimum value. Assuming that saturation voltages of the transistors 6, 33 and 36 are each $V_{sat}$ and base-emitter voltages of the transistors 33 and 34 are each $V_{be}$, the potential $V_{81}$ should be over at least the following value:

$$V_{81} = V_{sat} + V_{be} + V_i - V_{be} + V_{sat} + V_{sat} + V_O = 3\text{-}V_{sat} + V_i + V_O \tag{7}$$

Thus, because of the recent tendency to reduce power supply potential, there arises a problem that the conventional variable gain amplifier can only process a signal having small amplitude.

SUMMARY OF THE INVENTION

According to the present invention, an amplifier circuit comprises: (a) first and second differential input terminals for receiving first and second signals, respectively, which constitute differential input signals; (b) a signal generating means for applying a first bias to the first signal to generate a third signal, applying a first bias to the second signal to generate a fourth signal, applying the second bias to the first signal to generate a fifth signal and applying the second bias to the second signal to generate a sixth signal; (c) an output unit including (c-1) a first differential input unit for receiving the third and fourth signals to produce a first pair of differential currents, (c-2) a second differential input unit for receiving the fifth and sixth signals to produce a second pair of differential currents, (c-3) a constant current source for keeping the sum of the first and second pairs of differential currents at a constant value, (c-4) a pair of conversion means connected to the second differential input unit for converting the second pair of differential currents into voltage to obtain a differential signal output, and (c-5) a first voltage source connected to the pair of conversion means; (d) a differential signal output terminal provided with the differential signal output; and (e) a second voltage source for supplying electric power to the signal generating means and the output unit.

Preferably, the amplifier circuit further comprises (g) a buffer connected between the signal generating means and the output unit for reducing a current which flows out of the signal generating means so as to be less than a current which flows into the output unit.

The first and second differential input units perform differential operations in response to the pair of third and fourth signals and the pair of fifth and sixth signals, respectively. The sum of the currents flowing into the first and second differential input units is constant, so that a gain can be controlled according to the ratio of respective currents flowing into the first and second differential input units.

Thus, the variable gain amplifier in accordance with the present invention can process a signal having larger amplitude at the potential provided by the first constant voltage source, as compared with a conventional one. In other words, the first constant voltage source may provide lower potential than the conventional one in processing a signal having the same amplitude.

Accordingly, an object of the present invention is to achieve a variable gain amplifier which can process a signal having large amplitude even at a lower power supply potential, that is, a variable gain amplifier which allows the power supply potential to be lower without reducing the amplitude of the signal to be processed.

These and other objects, features, aspects and advantages of the present invention will become more apparent from the following detailed description of the present invention when taken in conjunction with the accompanying drawings.

DESCRIPTION OF THE PREFERRED EMBODIMENTS

A. Basic Idea:

Prior to the following detailed description of preferred embodiments, the basic idea of the present invention will be given. In the present invention, it is mainly intended to lower a power supply voltage by a collector-emitter saturation voltage of a transistor without reducing an amplitude of a signal to be processed. In the prior art, employed is a transistor which serves only to control gains, not to perform differential operation; responsive to differential input signals. In the present invention, however, a transistor for performing differential operation,is also used to control gains, thereby omitting the transistor for only controlling gains.

In order to achieve this, first to fourth transistors are provided in a variable gain amplifier. The pair of first and second transistors is provided with a signal which is obtained through application of the first bias to the differential input signal, and the other pair of third and fourth transistors is provided with another signal which is obtained through application of the second bias to the differential input signal. Then, both pairs perform a differential operation in response to the respective signals applied thereto.

On the other hand, the pair of first and third transistors divides a current which is provided thereto between respective transistors, as does the other pair of second and fourth transistors. Therefore, the differential output signal can be obtained from the pair of third and fourth transistors, and a gain of the differential output signal to the differential input signal can be controlled according to the current flowing through the first and second transistors. That is, it is possible to control the gain of the variable gain amplifier by the first and second biases.

Moreover, the number of transistors which are connected in series is reduced by one as compared with the prior art, so that it becomes possible to make the power supply voltage lower by using a collector-emitter saturation voltage of the transistor.

Figure 1:
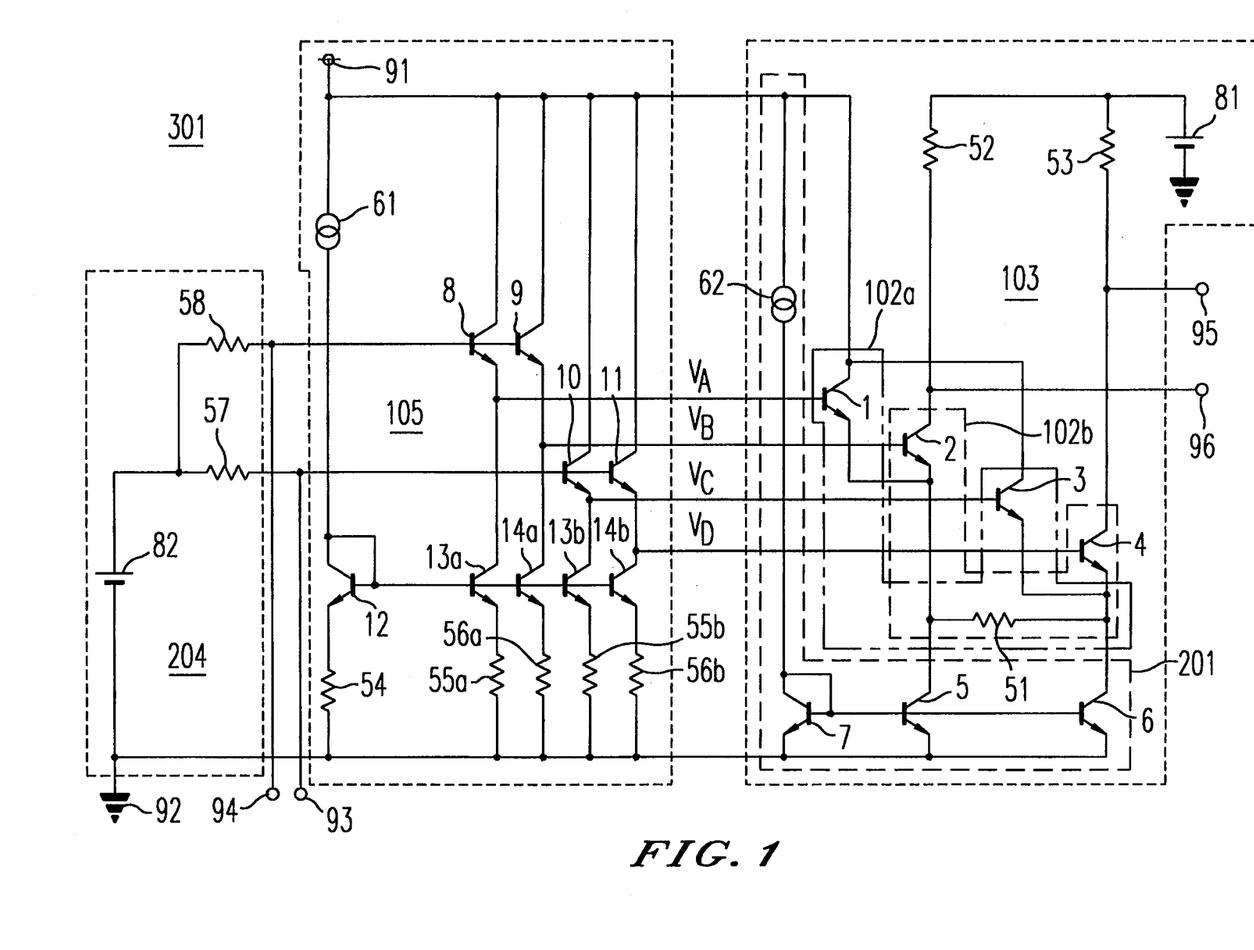
FIG. 1 is a circuit diagram showing a first preferred embodiment in accordance with the present invention.

B. The First Preferred Embodiment:

FIG. 1 is a circuit diagram of a variable gain amplifier 301 in accordance with the first preferred embodiment of the present invention. The variable gain amplifier 301 comprises a gain bias unit 105, an input bias unit 204 and an output unit 103. Differential input terminals 93 and 94 are connected to the gain bias unit 105 and the input bias unit 204, and differential output terminals 95 and 96 are connected to the output unit 103.

The output unit 103 comprises differential input unit 102a and 102b. The differential input unit 102a comprises transistors 1, 3 and a resistor 51 which is connected between the emitters thereof. Bases of the transistors 1 and 3 are provided with the first pair of potentials $V_A$ and $V_C$, respectively, by the gain bias unit 105. The differential input unit 102b comprises transistors 2, 4 and a resistor 51 which is connected between the emitters thereof. Bases of the transistors 2 and 4 are provided with the second pair of potentials $V_B$ and $V_D$, respectively, by the gain bias unit 105. The differential input units 102a and 102b have the resistor 51 in common. The transistors 1 to 4 correspond to the first, third, second, fourth transistors described in "A. Basic Idea", respectively.

The output unit 103 comprises a voltage source 81, resistors 52 and 53 each having one end connected to the voltage source 81. The other ends of the resistors 52 and 53 are connected to collectors of the transistors 2 and 4, respectively, and also to the differential output terminals 96 and 95. Collectors of the transistors 1 and 3 are connected to the power supply 91 in common.

The output unit 103 further comprises a current supply unit 201. The differential input units 102a and 102b are thereby supplied with a constant current. The current supply unit 201 comprises a current source 62 and a transistor 7 which are connected in series between the power supply 91 and a ground 92. That is, one end of the current source 62 is connected to the power supply 91 and the other end thereof is connected to a collector of the transistor 7. An emitter of the transistor 7 is connected to the ground 92, and a base of the transistor 7 is connected to the collector thereof. The current supply unit 201 further comprises transistors 5 and 6. A collector of the transistor 5 is connected to one end of the resistor 51 and a collector of the transistor 6 is connected to the other end. Emitters of the transistors 5 and 6 are connected to the emitter of the transistor 7 in common, and bases of the transistors 5 and 6 are connected to the base of the transistor 7 in common. That is, the current supply unit 201 has a current mirror circuit configuration, thereby supplying a constant current to the differential input units 102a and 102b.

The gain bias unit 105 applies predetermined biases to differential input signals which are provided to the differential input terminals 93 and 94, to thereby output two pairs of potentials ($V_A$, $V_C$) and ($V_B$, $V_D$). The two pairs of potentials ($V_A$, $V_C$) and ($V_B$, $V_D$) correspond to "signals which are obtained through application of the first and second biases to the differential input signals" described in "A. Basic idea".

In the gain bias unit 105, transistors 8, 13a and a resistor 55a are connected in series between the power supply 91 and the ground 92. That is, a collector of the transistor 8 is connected to the power supply 91, and an emitter thereof is connected to a collector of the transistor 13a. An emitter of the transistor 13a is connected to the ground 92 through the resistor 55a. Other trios of transistors 9, 14a and a resistor 56a, transistors 10, 13b and a resistor 55b, and transistors 11, 14b and a resistor 56b have the same connection as above.

Bases of the transistors 13a, 14a, 13b and 14b are connected to a base and a collector of the transistor 12 in common. An emitter of the transistor 12 is connected to the ground 92 through a resistor 54, and the collector thereof is connected to the power supply 91 through a current source 61. That is, the transistors 12, 13a, 14a, 13b, 14b, the resistors 54, 55a, 56a, 55b, 56b and the current source 61 constitute a current mirror circuit, thereby supplying predetermined currents to the transistors 8 to 11. Therefore, it is possible to obtain the above potentials $V_A$, $V_B$, $V_C$ and $V_D$ from emitters of the transistors 8 to 11, respectively. Furthermore, by controlling the currents which the current mirror circuit consisting of the transistors 12, 13a, 14a, 13b and 14b supplies to the transistors 8 to 11, the value of difference between the potentials $V_A$ and $V_c$ can be maintained at a value equal to the difference between the potentials which have been applied to the differential input terminals 93 and 94, respectively. The same applies to the difference between the potentials $V_B$ and $V_D$.

Further, the differential input terminals 93 and 94 are connected to the input bias unit 204. The input bias unit 204 includes of a voltage source 82 and resistors 57 and 58 which are connected to the ground 92 through the voltage source 82. The differential input terminals 93 and 94 are connected to the voltage source 82 through the resistors 57 and 58, respectively. Through the above configuration, the differential input signals are so biased as to be applicable to the range of the differential operation of the transistors 8 to 11.

In the above-mentioned configuration, the differential input units 102a and 102b perform differential operation in response to the two pairs of signals ($V_A$, $V_C$) and ($V_B$, $V_D$), respectively, which are obtained through application of two different biases to the differential input signals.

On the other hand, an emitter of the transistor 1 of the differential input unit 102a and an emitter of the transistor 2 of the differential input unit 102b are connected in common to the one end of the resistor 51. Therefore, the value of a signal which is provided by the differential output terminal 96 depends on not only the value of the differential input signal but also the collector currents respectively of the transistors I and 2. Further these currents depend on the two different biases in magnitude, which are applied to the differential input signals by the gain bias unit 105.

Assuming now that base-emitter voltages of the transistors 1, 2, 8 and 9 are $V_1$, $V_2$, $V_8$ and $V_9$, collector currents of the transistors 1 and 2 are $I_1$ and $I_2$, and emitter currents of the transistors 8 and 9 are $I_8$ and $I_9$, respectively, they are expressed as follows ignoring base currents of the transistors 1 and 2:

$$V_1 = K \ln \frac{I_1}{I_0}, \tag{8}$$

$$V_2 = K \ln \frac{I_2}{I_0},$$

-continued $$V_8 = K \ln \frac{I_8}{I_0},$$

$$V_9 = K \ln \frac{I_9}{I_0}$$

where K and $I_0$ are constants.

From FIG. 1, the following can be seen:

$$V_2 - V_1 = V_8 - V_9 \quad (9)$$

Then, the following expression can be deduced from Formulae 8 and 9:

$$\frac{I_2}{I_1 + I_2} = \frac{I_8}{I_8 + I_9} \quad (10)$$

Therefore, the current in the resistor 52 out of the sum of currents in the transistor 5 and the resistor 51 is expressed as $I_8/(I_8+I_9)$. The emitter currents of the transistors 8 and 9, $I_8$ and $I_9$, may be set from zero to an arbitrary value depending on the resistance values of the resistors 55a and 56a, respectively. The same applies to the operation performed by the transistors 3, 4, 10 and 11, where emitter currents of the transistors 10 and 11 can be controlled according to the resistance values of the resistors 55b and 56b, respectively.

When the transistors 8 and 10, 9 and 11, 13a and 13b, and 14a and 14b have the same specifications in the respective pairs, and the resistors 55a and 55b, and 56a and 56b have the same resistance values, respectively, the gain G of the variable gain amplifier 301 is expressed as follows:

$$G = \frac{I_8}{I_8 + I_9} \cdot \frac{R_L}{R_E/2 + r_e} \quad (11)$$

Ignoring base currents of the transistors 1 to 4, the variable range of the gain is from zero to $R_L/(R_E/2+r_e)$, where $R_E$, $R_L$ and $r_e$ are resistance values of the resistors 51, 52 and emitter resistance of each transistor, respectively.

Consider now a minimum potential which the voltage source 81 should provide. Application of voltage at the differential output terminal 96 and the transistors 2, 4, 6 and 14b will be examined, assuming that saturation voltages of the transistors 2, 6 and 14b are each $V_{sat}$ and base-emitter voltages of the transistors 2 and 4 are each $V_{be}$.

When a current in the resistor 56b is small enough, a minimum potential at the emitter of the transistor 11 is the sum of a saturation voltage of the transistor 6 and a base-emitter voltage of the transistor 4, that is, $V_{sat}+V_{be}$. On the other hand, since the transistors 9, 14a and the resistor 56a have the same specifications as the transistors 11, 14b and the resistor 56b, respectively, a minimum value of potential at the base of the transistor 2 is $V_{sat}+V_{be}+V_i$ where an amplitude of the differential input signal is $V_i$.

Accordingly, a minimum a collector potential of the transistor 2, i.e., a minimum potential at the differential output terminal 96 is expressed as follows, in consideration of the saturation voltage and base-emitter voltage of the transistor 2:

$$V_{sat}+V_{be}+V_i-V_{be}+V_{sat}=2V_{sat}+V_i \quad (12)$$

Assuming that an amplitude of the differential output signal is $V_o$, the minimum potential $V_{81}$ which the voltage source 81 should provide can be given as follows:

$$V_{81}=V_{sat}+V_{be}+V_i-V_{be}+V_{sat}+V_O=2V_{sat}+V_i+V_O \quad (13)$$

In consequence, it can be seen that the minimum potential $V_{81}$ may be lower by a saturation voltage $V_{sat}$, of one transistor than that of the prior art as indicated in Formula 7. In other words, the variable gain amplifier 301 can process a larger signal by using a voltage $V_{sat}$ as compared to the conventional variable gain amplifier 300 at the same voltage $V_{81}$.

Figure 2:
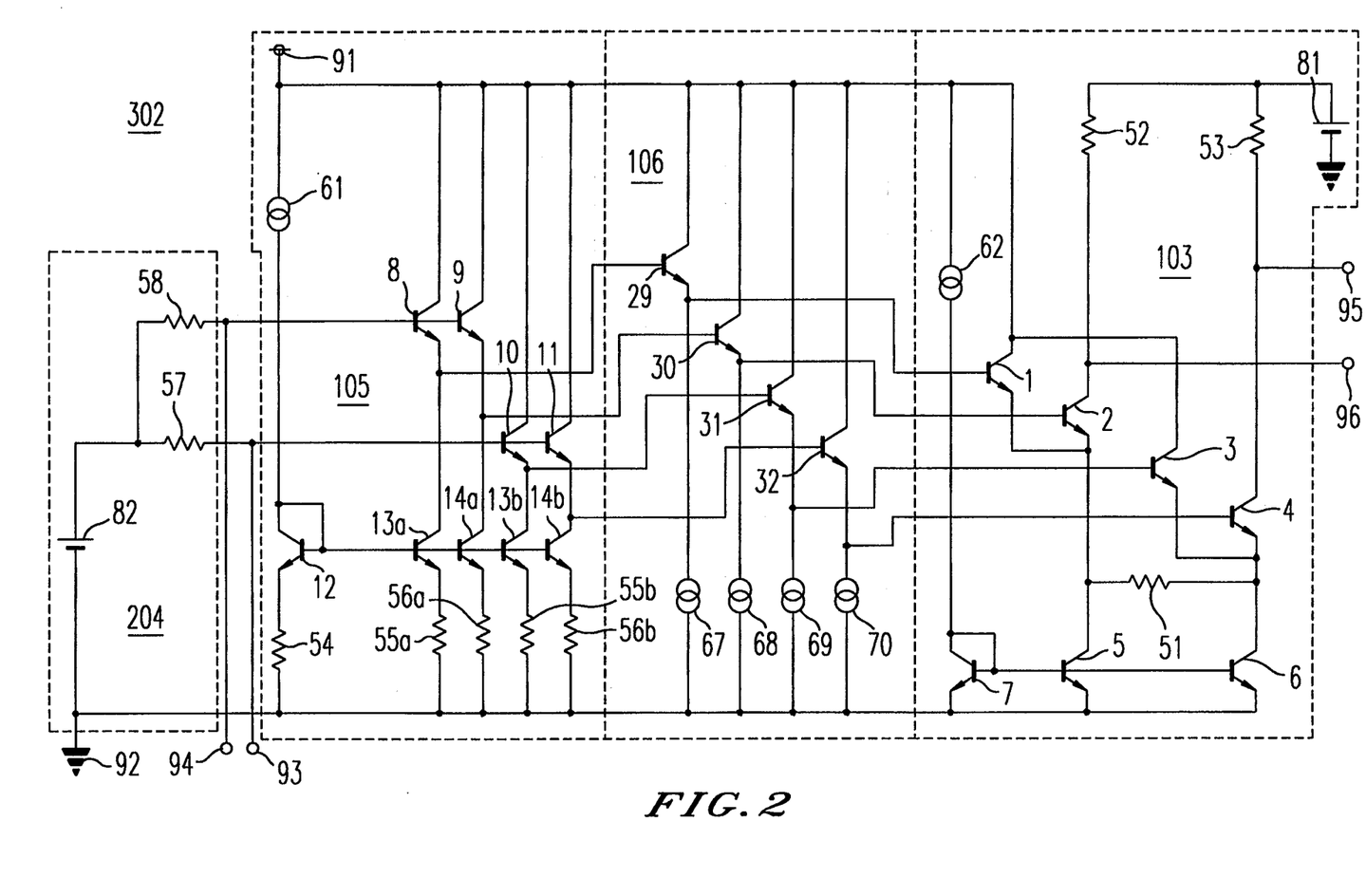
FIG. 2 is a circuit diagram showing a second preferred embodiment in accordance with the present invention.

C. The Second Preferred Embodiment:

FIG. 2 is a circuit diagram of a variable gain amplifier 302 in accordance with the second preferred embodiment of the present invention. The variable gain amplifier 302 has the same configuration as the variable gain amplifier 301 of FIG. 1 except that it further comprises a buffer 106 between the output unit 103 and the gain bias unit 105.

In the buffer 106, a collector of a transistor 29 is connected to the power supply 91 and an emitter thereof is connected to the one end of a current source 67. The other end of the current source 67 is connected to the ground 92. That is, the transistor 29 and the current source 67 are connected in series between the power supply 91 and the ground 92. Likewise, a transistor 30 and a current source 68, a transistor 31 and a current source 69, and a transistor 32 and a current source 70 are connected in series, respectively, between the power supply 91 and the ground 92.

Bases of the transistors 29 to 32 are connected to the emitters of the transistors 8 to 11 in the gain bias unit 105, respectively. Emitters of the transistors 29 to 32 are connected to the bases of the transistors 1 to 4 in the output unit 103, respectively. Namely, the buffer 106 has emitter follower circuit configurations, each of which receives signals obtained through application of two different biases to the differential input signals and provides the signals to the output unit 103.

By providing the buffer 106, it is possible to improve the variable gain amplifier 301 in accordance with the first embodiment. In the variable gain amplifier 301 referred to in the first preferred embodiment, assuming that a voltage across the resistor 56b is $V_R$, which is larger than the sum of saturation voltage $V_{sat}$ and base-emitter voltage $V_{be}$ of each transistor, a minimum potential at the emitter of the transistor 11 is $V_{sat}+V_R$ and a minimum potential $V_{81}$ which the voltage source 81 provides should be at least, as follows;

$$V_{81}=V_R+V_{sat}+V_i-V_{be}+V_{sat}+V_O=2V_{sat}+V_iV_O+V_RV_{be} \quad (14)$$

However, the following condition should be considered:

$$V_R \geqq V_{be}+V_{sat} \quad (15)$$

After all, the potential $V_{81}$ which the voltage source 81 provides should be at least, as follows;

$$V_{81}=3V_{sat}+V_i+V_O \quad (16)$$

Thus, even in the variable gain amplifier 301, the potential $V_{81}$ needs the same potential as the conventional one.

Even if the voltage $V_R$ across the resistor 56b is large, the buffer 106 provided in the variable gain amplifier 302 can ease the requirement for the potential $V_{81}$. When base-emitter voltages of the transistors 29 to 32 are each set at $V_{be}$, it can be seen that the minimum potential $V_{81}$ is lower than the value defined in Formula 16 by the voltage $V_{be}$, in consideration of the amplitude of the differential output signal, the saturation voltages and base-emitter voltages of the transistors 1 to 4, the base-emitter voltages of the transistors 29 to 32 and that the minimum potential at each emitter of the transistors 8 to 11 is $V_{sat} + V_R$.

It is also possible to reduce the currents (base currents of the transistors 29 to 30) of the signals outputted from the emitters of the transistors 8 to 11 (two pairs of signals obtained through application of different biases to the differential input signals) in quantity so as to be less than the base currents of the transistors 1 to 4.

In the variable gain amplifier 301 of the first embodiment, it is considered that the emitter currents of the transistors 8 to 11 can be zero, ignoring the base currents of the transistors 1 to 4. Actually, the emitter currents of the transistors 8 to 11 can not be zero because of the base currents of the transistors 1 to 4. Accordingly, an actual variable range of the gain is narrower than the range from zero to $R_L/(R_E/2+r_e)$. On the contrary, in the variable gain amplifier 302, the currents in the transistors 29 to 32 are smaller, so that they do not significantly affect the variable range of the gain. Therefore, it is possible to make the variable range of the gain much closer to the range from zero to $R_L/(R_E/2+r_e)$, as compared with the first embodiment.

In short, it is possible to achieve an amplifier with a large variable range of gain while reducing the potential $V_{81}$.

Figure 3:
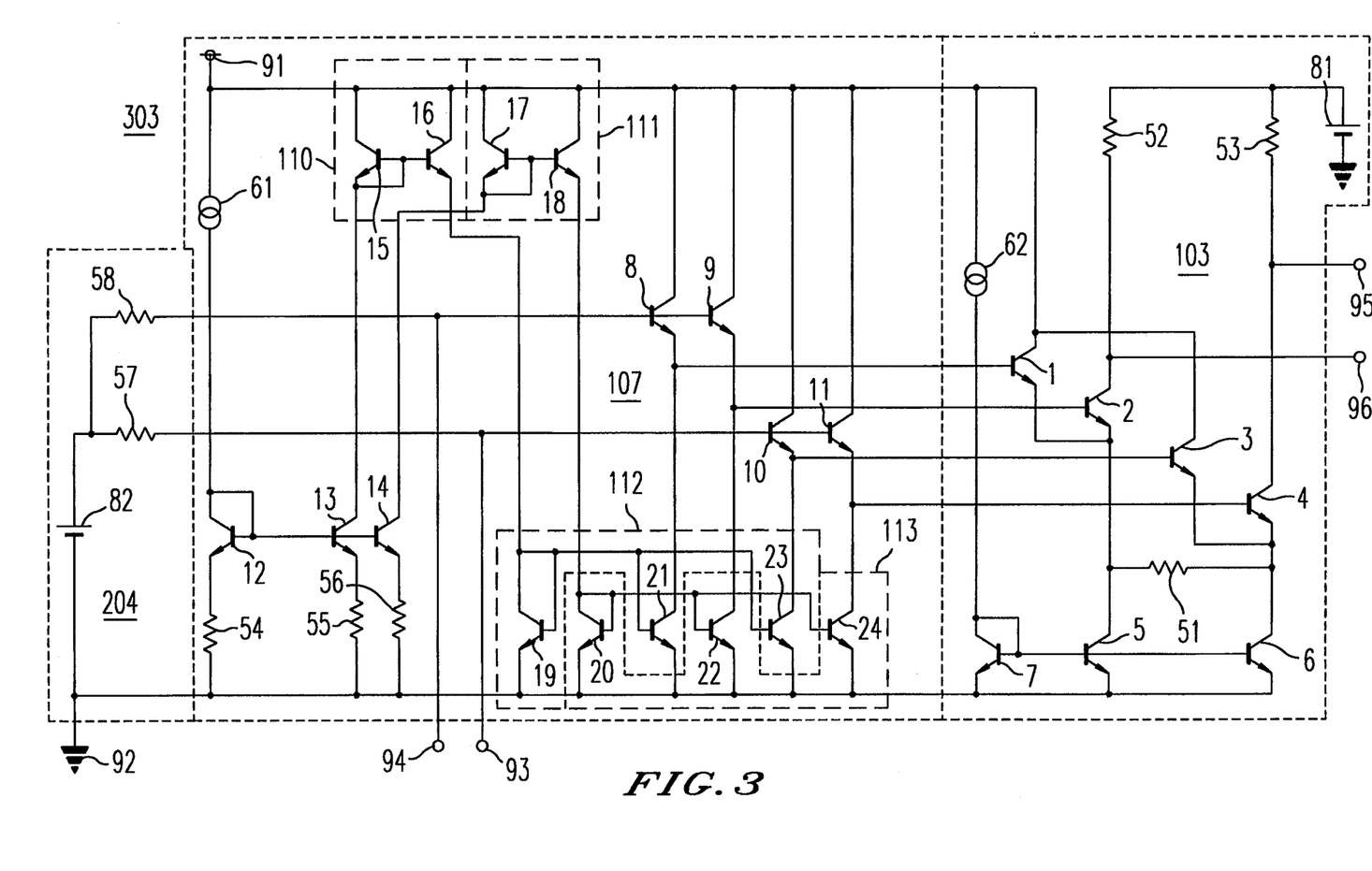
FIG. 3 is a circuit diagram showing a third preferred embodiment in accordance with the present invention.

D. The Third Preferred Embodiment:

FIG. 3 is a circuit diagram of a variable gain amplifier 303 in accordance with the third preferred embodiment of the present invention. The variable gain amplifier 303 has the same configuration as the variable gain amplifier 301 of FIG. 1 except that it comprises a gain bias unit 107 instead of the gain bias unit 105.

The gain bias unit 107 is different from the gain bias unit 105 in loads which are connected to the emitters of the transistors 8 to 11. In the gain bias unit 105, the emitter of the transistor 8 is directly connected to the transistor 13a and the resistor 55a. On the other hand, in the gain bias unit 107, the emitter of the transistor 8 is connected through the transistors 21, 19, 16 and 15 to the transistor 13 and the resistor 55.

Likewise, the emitter of the transistor 9 is connected through the transistors 22, 20, 18 and 17 to the transistor 14 and the resistor 56, the emitter of the transistor 10 is connected through the transistors 23, 19, 16 and 15 to the transistor 13 and the resistor 55, and the emitter of the transistor 11 is connected through the transistors 24, 20, 18 and 17 to the transistor 14 and the resistor 56 in the gain bias unit 107.

The current source 61, the transistors 12 to 14 and the resistors 54 to 56 make up a current mirror circuit configuration, thereby supplying constant currents as collector currents of the transistors 13 and 14. On the other hand, the groups of transistors 15, 16, transistors 17, 18, transistors 19, 21, 23 and transistors 20, 22, 24 make up current mirror circuits 110 to 113, respectively. Accordingly, emitter currents of the transistors 8 to 11 are controlled by the resistors 54 to 56.

After all, the gain bias unit 107 has the same function as the gain bias unit 105 in the variable gain amplifier 301 to provide the output unit 103 with two pairs of signals which are obtained through application of different biases to the differential input signals. Accordingly, the gain of the variable gain amplifier 303 is also variable from zero to $R_L/(R_E/2+r_e)$, ignoring the base currents of the transistors 1 to 4.

In the gain bias unit 107, however, between the transistors 8 to 11 and the ground 92, connected are the transistors 21 to 24 instead of the resistors 55a, 55b, 56a and 56b, so that the potentials at the emitters of the transistors 8 to 11 can be held sufficiently low. Therefore, the minimum potential $V_{81}$ is equal to the value defined in Formula 13, without limitation of the first embodiment as given in the description of the second embodiment.

Figure 4:
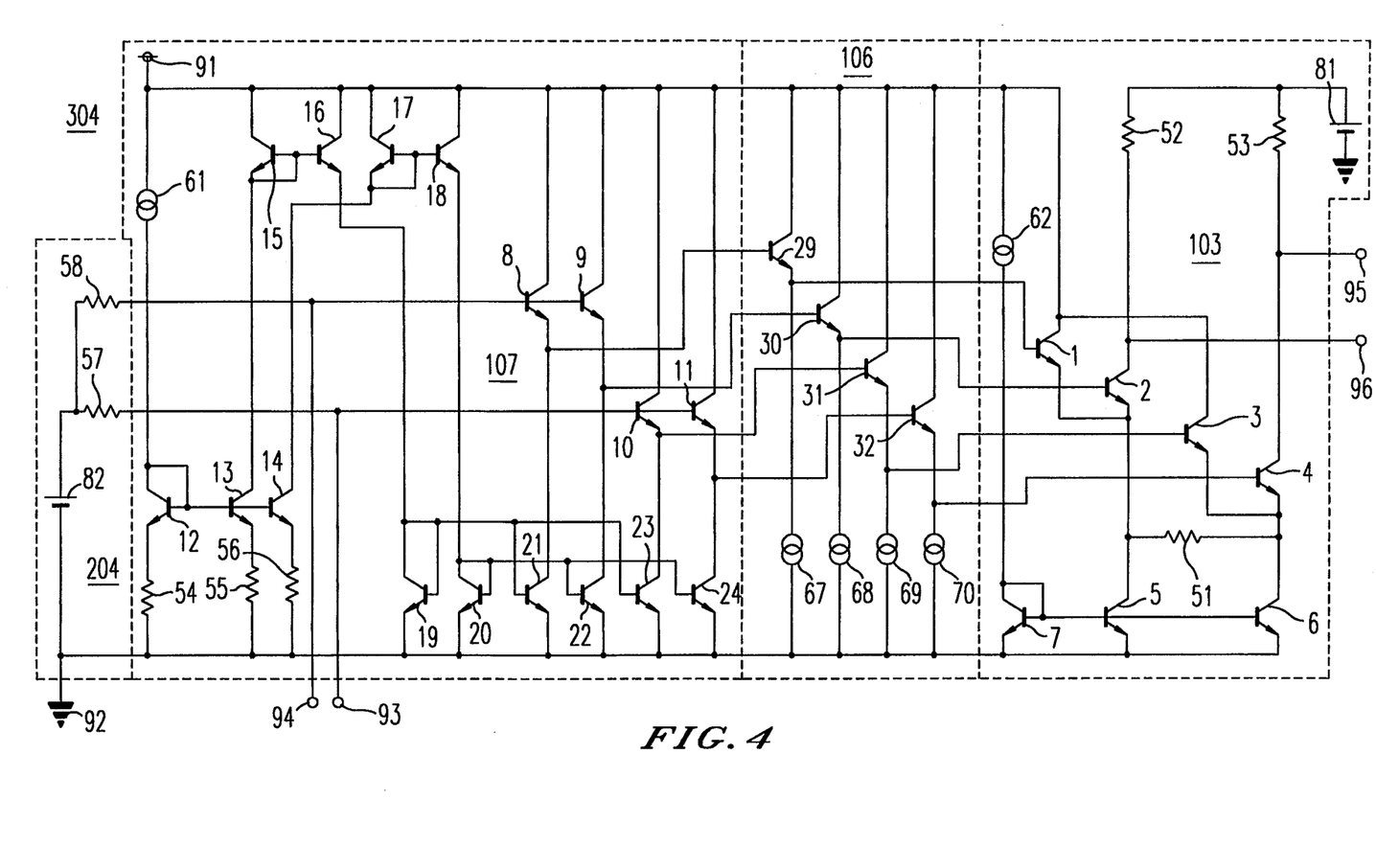
FIG. 4 is a circuit diagram showing a fourth preferred embodiment in accordance with the present invention.

E. The Fourth Preferred Embodiment:

FIG. 4 is a circuit diagram of a variable gain amplifier 304 in accordance with the fourth preferred embodiment of the present invention. The variable gain amplifier 304 has the same configuration as the variable gain amplifier 303 of FIG. 3 except that it further comprises the buffer 106 between the output unit 103 and the gain bias unit 107.

Accordingly, the minimum potential $V_{81}$ is equal to the value defined in Formula 13 as in third embodiment, and a variable range of the gain becomes wider than that of the third embodiment in the same manner as the second embodiment.

Figure 5:
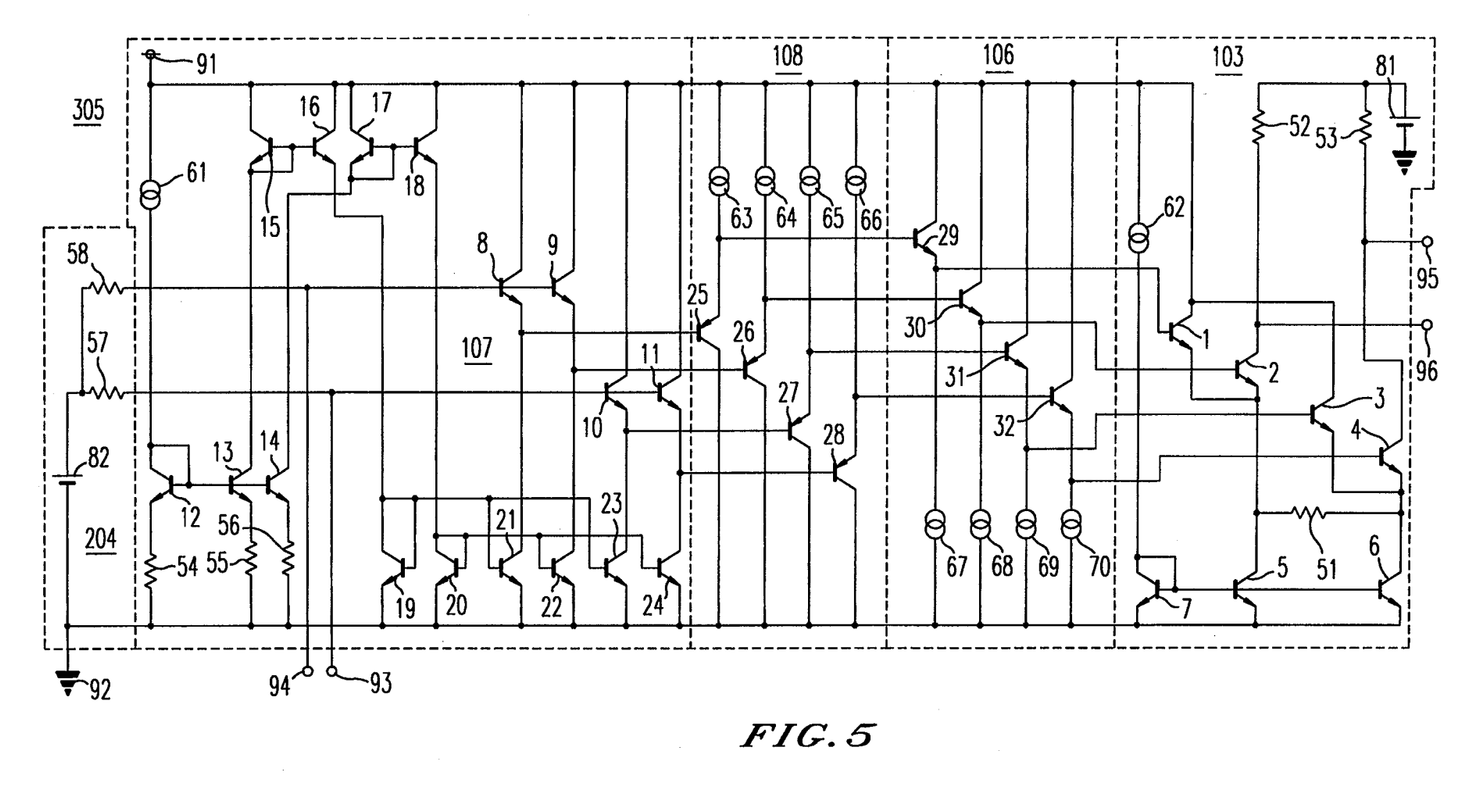
FIG. 5 is a circuit diagram showing a fifth preferred embodiment in accordance with the present invention.

F. The Fifth Preferred Embodiment:

FIG. 5 is a circuit diagram of a variable gain amplifier 305 in accordance with the fifth preferred embodiment of the present invention. The variable gain amplifier 305 has the same configuration as the variable gain amplifier 304 of FIG. 4 except that it further comprises a buffer 108 between the buffer 106 and the gain bias unit 107.

In the buffer 108, one end of the current source 63 is connected to the power supply 91 and the other end is connected to an emitter of a transistor 25. In the transistor 25, a collector is connected to the ground 92, a base is connected to the emitter of the transistor 8 in the gain bias unit 107 and the emitter is connected to the base of the transistor 29 in the buffer 106.

Each of the groups of transistors 9, 26, 30 and a current source 64, transistors 10, 27, 31 and a current source 65, and transistors 11, 28, 32 and a current source 66 have the same connection as above. In short, the buffer 108 has emitter follower circuit configurations like the buffer 106. Further, the transistors which constitute the buffer 108 are of PNP type while the transistors which constitute the buffer 106 are of NPN type.

In the variable gain amplifier 305, because of double emitter follower circuits provided between the transistors 8 to 11 in the gain bias unit 107 and the transistors 1 to 4 in the output unit 103, respectively, fewer currents are drawn out of the emitter currents of the transistors 8 to 11 as compared with the variable gain amplifier 304, thereby obtaining a wider variable range of the gain. Moreover, the minimum potential which the voltage source 81 should provide is the value as defined in Formula 13, which is lower than that of a the prior art.

In addition, by providing the buffer 108 in the variable gain amplifier 305, it is possible to improve the variable gain amplifier 304. Consider a minimum potential $V_{91}$ which the voltage source 91 should provide in the variable gain amplifier 304. Assuming that in each transistor, a saturation voltage is $V_{sat}$, a base-emitter voltage is $V_{be}$ and an amplitude of the differential input signal is $V_i$, the minimum potential $V_{91}$ can be given as follows, by calculating e.g. the saturation voltages of the transistors 6 and 9 and the base-emitter voltages of the transistors 4, 32, 1 1 and 9:

$$V_{91} = V_{sat} + V_{be} + V_{be} + V_{be} + V_i - V_{be} + V_{sat} = 2V_{sat} + 2V_{be} + V_i \quad (17)$$

On the other hand, in the variable gain amplifier 305, it is possible to make the base potentials of the transistors 1 to 4 in correspondence with the potentials of the transistors 8 to 11, respectively, by setting the base-emitter voltages of the transistors which constitute the buffer 108 for $V_{be}$ each. Accordingly, the minimum potential $V_{91}$ which the power supply 91 should provide is given as follows:

$$V_{91} = 2V_{sat} + V_{be} + V_i \quad (18)$$

The value of Formula 18 is less than the value of Formula 17 by $V_{be}$. In other words, the variable gain amplifier of the fifth embodiment can process a signal with higher amplitude by the voltage $V_{be}$, as compared with the fourth embodiment at the same potentials $V_{91}$.

While the invention has been shown and described in detail, the foregoing description is in all aspects illustrative and not restrictive. It is therefore understood that numerous modifications and variations can be devised without departing the scope of from the invention.

I claim:
1. An amplifier circuit, comprising:
   (a) first and second differential input terminals for receiving first and second signals, respectively, which constitute differential input signals;
   (b) a signal generating means for applying a first bias to said first signal to generate a third signal, applying said first bias to said second signal to generate a fourth signal, applying a second bias to said first signal to generate a fifth signal and applying said second bias to said second signal to generate a sixth signal;
   (c) an output unit including:
      (c-1) a first differential input unit for receiving said third and fourth signals to produce a first pair of differential currents,
      (c-2) a second differential input unit for receiving said fifth and sixth signals to produce a second pair of differential currents,
      (c-3) a constant current source for keeping the sum of said first and second pairs of differential currents at a constant value,
      (c-4) a pair of conversion means connected to said second differential input unit for converting said second pair of differential currents into voltage to obtain a differential signal output, and
      (c-5) a first voltage source connected to said pair of conversion means;
   (d) a differential signal output terminal provided with said differential signal output; and
   (e) a second voltage source for supplying electric power to said signal generating means and said output unit.
2. The amplifier circuit of claim 1, wherein said first and second differential input units have in common a first resistance including a first end and a second end and
said first differential input unit includes
   (c-1-1) a first transistor including a control electrode whereto said third signal is applied, a first current electrode and a second current electrode, and
   (c-1-2) a second transistor including a control electrode whereto said fourth signal is applied, a first current electrode and a second current electrode;
said second differential input unit includes
   (c-2-1) a third transistor including a control electrode whereto said fifth signal is applied, a first current electrode and a second current electrode, and
   (c-2-2) a fourth transistor including a control electrode whereto said sixth signal is applied, a first current electrode and a second current electrode;
said respective second current electrodes of said first and third transistors are connected to said first end of said first resistance in common;
said respective second current electrodes of said second and fourth transistors are connected to said second end of said first resistance in common;
said respective first current electrodes of said first and second transistors are connected to said second voltage source; and
said respective first current electrodes of said third and fourth transistors are connected to each of said pair of conversion means.
3. The amplifier circuit of claim 2, wherein
said first to fourth transistors are bipolar transistors, and
said control electrode, first and second current electrodes thereof correspond to base electrode, collector and emitter electrodes, respectively.
4. The amplifier circuit of claim 3, wherein
base-emitter voltages of said first to fourth transistors are equal to one another and so are collector-emitter saturation voltages thereof.
5. The amplifier circuit of claim 2, wherein
said signal generating means comprises
   (b-1) first and second constant current sources for producing a first constant current and third and fourth constant current sources for producing a second constant current,
   (b-2) a fifth transistor including a control electrode whereto said first signal is applied, a first current electrode connected to said second voltage source and a second current electrode connected to said first constant current source,
   (b-3) a sixth transistor including a control electrode whereto said first signal is applied, a first current electrode connected to said second voltage source and a second current electrode connected to said third constant current source,
   (b-4) a seventh transistor including a control electrode whereto said second signal is applied, a first current electrode connected to said second voltage source and a second current electrode connected to said second constant current source, and
   (b-5) an eighth transistor including a control electrode whereto said second signal is applied, a first current electrode connected to said second voltage source and a second current electrode connected to said fourth constant current source, and wherein said first and second biases are determined according to said first and second constant currents, respectively.

6. The amplifier circuit of claim 5, wherein
said fifth to eighth transistors are bipolar transistors, and said control electrode, first and second current electrodes thereof correspond to base electrode, collector and emitter electrodes, respectively.

7. The amplifier circuit of claim 6, wherein
base-emitter voltages of said fifth to eighth transistors are equal to one another and so are collector-emitter saturation voltages thereof.

8. The amplifier circuit of claim 7, wherein
said signal generating means further comprises
 (b-6) a fifth constant current source including a first end which is connected to said second voltage source and a second end;
 (b-7) a ninth transistor including a control electrode and a first current electrode which are connected to said second end of said fifth constant current source in common and a second current electrode; and
 (b-8) a second resistance including a first end which is connected to said second current electrode of said ninth transistor and a second end.

9. The amplifier circuit of claim 8, wherein
said first constant current source has
 (b-1-1) a tenth transistor including a control electrode Which is connected to said control electrode of said ninth transistor, a first current electrode which is connected to said second current electrode of said fifth transistor and a second current electrode; and
 (b-1-2) a third resistance including a first end which is connected to said second current electrode of said tenth transistor and a second end which is connected to said second end of said second resistance,
said second constant current source has
 (b-1-3) an eleventh transistor including a control electrode which is connected to said control electrode of said ninth transistor, a first current electrode which is connected to said second current electrode of said seventh transistor and a second current electrode; and
 (b-1-4) a fourth resistance including a first end which is connected to said second current electrode of said eleventh transistor and a second end which is connected to said second end of said second resistance,
said third constant current source has
 (b-1-5) a twelfth transistor including a control electrode which is connected to said control electrode of said ninth transistor, a first current electrode which is connected to said second current electrode of said sixth transistor and a second current electrode; and
 (b-1-6) a fifth resistance including a first end which is connected to said second current electrode of said twelfth transistor and a second end which is connected to said second end of said second resistance,
said fourth constant current source has
 (b-1-7) a thirteenth transistor including a control electrode which is connected to said control electrode of said ninth transistor, a first current electrode which is connected to said second current electrode of said eighth transistor and a second current electrode; and
 (b-1-8) a sixth resistance including a first end which is connected to said second current electrode of said thirteenth transistor and a second end which is connected to said second end of said second resistance.

10. The amplifier circuit of claim 8, wherein
said first constant current source has
 (b-1-1) a tenth transistor including a control electrode which is connected to said control electrode of said ninth transistor;
 (b-1-2) a third resistance connected between said second current electrode of said tenth transistor and said second end of said second resistance; and
 (b-1-3) a first current conversion circuit for converting a current in said first current electrode of said tenth transistor into said first constant current,
said second constant current source has
 (b-1-4) a second current conversion circuit for converting a current in said first current electrode of said tenth transistor into said first constant current,
said third constant current source has
 (b-1-5) an eleventh transistor including a control electrode which is connected to said control electrode of said ninth transistor and first and second current electrodes;
 (b-1-6) a fourth resistance connected between said second current electrode of said eleventh transistor and said second end of said second resistance; and
 (b-1-7) a third current conversion circuit for converting a current in said first current electrode of said eleventh transistor into said second constant current, and
said fourth constant current source has
 (b-1-8) a fourth current conversion circuit for converting a current in said first current electrode of said eleventh transistor into said second constant current.

11. The amplifier circuit of claim 10, wherein
said first and second current conversion circuits have in common a first current mirror circuit which is connected to said first current electrode of said tenth transistor for outputting a current in proportion to a current in said first current electrode of said tenth transistor;
said first current conversion circuit further has a second current mirror circuit which is connected to said first current mirror circuit and said second current electrode of said fifth transistor for outputting a current in proportion to a current output from said first current mirror circuit;
said second current conversion circuit further has a third current mirror circuit which is connected to said first current mirror circuit and said second current electrode of said seventh transistor for outputting a current in proportion to a current output of said first current mirror circuit;
said third and fourth current conversion circuits have in common a fourth current mirror circuit which is connected to said first current electrode of said eleventh transistor for outputting a current in proportion to a current in said first current electrode of said eleventh transistor;

said third current conversion circuit further has a fifth current mirror circuit which is connected to said fourth current mirror circuit and said second current electrode of said sixth transistor for outputting a current in proportion to a current output from said fourth current mirror circuit; and said fourth current conversion circuit further has a sixth current mirror circuit which is connected to said fourth current mirror circuit and said second current electrode of said eighth transistor for outputting a current in proportion to a current output of said fourth current mirror circuit.

12. The amplifier circuit of claim 11, wherein said second and third current mirror circuits have in common a twelfth transistor including a first current electrode which is connected to said first current mirror circuit, a second current electrode and a control electrode;

said second current mirror circuit further has a thirteenth transistor including a control electrode which is connected to said control electrode of said twelfth transistor, a first current electrode which is connected to said second current electrode of said fifth transistor and a second current electrode which is connected to said second current electrode of said twelfth transistor;

said third current mirror circuit further has a fourteenth transistor including a control electrode which is connected to said control electrode of said twelfth transistor, a first current electrode which is connected to said second current electrode of said seventh transistor and a second current electrode which is connected to said second current electrode of said twelfth transistor;

said fifth and sixth current mirror circuits have in common a fifteenth transistor including a first current electrode which is connected to said fourth current mirror circuit, a second current electrode and a control electrode;

said fifth current mirror circuit further has a sixteenth transistor, including a control electrode which is connected to said control electrode of said fifteenth transistor, a first current electrode which is connected to said second current electrode of said sixth transistor and a second current electrode which is connected to said second current electrode of said fifteenth transistor;

said sixth current mirror circuit further has a seventeenth transistor including a control electrode which is connected to said control electrode of said fifteenth transistor, a first current electrode which is connected to said second current electrode of said eighth transistor and a second current electrode which is connected to said second current electrode of said fifteenth transistor.

13. The amplifier circuit of claim 1, wherein said conversion means comprises a resistance element.

14. The amplifier circuit of claim 1 further comprising (f) An input bias unit for applying an input bias to said differential input signal.

15. The amplifier circuit of claim 1 further comprising (g) a buffer connected between said signal generating means and said output unit for reducing a current which flows out of said signal generating means so as to be less than a current which flows into said output unit.

16. The amplifier circuit of claim 15, wherein said first and second differential input units have in common a first resistance including a first end and a second end and said first differential input unit includes
  (c-1-1) a first transistor including a control electrode whereto said third signal is applied, a first current electrode and a second current electrode, and
  (c-1-2) a second transistor including a control electrode whereto said fourth signal is applied, a first current electrode and a second current electrode;

said second differential input unit includes
  (c-2-1) a third transistor including a control electrode whereto said fifth signal is applied, a first current electrode and a second current electrode, and
  (c-2-2) a fourth transistor including a control electrode whereto said sixth signal is applied, a first current electrode and a second current electrode;

said respective second current electrodes of said first and third transistors are connected to said first end of said first resistance in common;

said respective second current electrodes of said second and fourth transistors are connected to said second end of said first resistance in common;

said respective first current electrodes of said first and second transistors are connected to said second voltage source; and said respective first current electrodes of said third and fourth transistors are connected to each of said pair of conversion means.

17. The amplifier circuit of claim 16, wherein said signal generating means comprises
  (b-1) first and second constant current sources for producing a first constant current and third and fourth constant current sources for producing a second constant current,
  (b-2) a fifth transistor including a control electrode whereto said first signal is applied, a first current electrode connected to said second voltage source and a second current electrode connected to said first constant current source,
  (b-3) a sixth transistor including a control electrode whereto said first signal is applied, a first current electrode connected to said second voltage source and a second current electrode connected to said third constant current source,
  (b-4) a seventh transistor including a control electrode whereto said second signal is applied, a first current electrode connected to said second voltage source and a second current electrode connected to said second constant current source, and
  (b-5) an eighth transistor including a control electrode whereto said second signal is applied, a first current electrode connected to said second voltage source and a second current electrode connected to said fourth constant current source, and wherein said first and second biases are determined according to said first and second constant currents, respectively.

18. The amplifier circuit of claim 17, wherein
said buffer comprises
- (g-1) a ninth transistor including a control electrode which is connected to said second current electrode of said fifth transistor, a first current electrode which is connected to said second voltage source and a second current electrode which is connected to said control electrode of said first transistor;
- (g-2) a tenth transistor including a control electrode which is connected to said second current electrode of said sixth transistor, a first current electrode which is connected to said second voltage source and a second current electrode which is connected to said control electrode of said third transistor;
- (g-3) an eleventh transistor including a control electrode which is connected to said second current electrode of said seventh transistor, a first current electrode which is connected to said second voltage source and a second current electrode which is connected to said control electrode of said second transistor;
- (g-4) a twelfth transistor including a control electrode which is connected to said second current electrode of said eighth transistor, a first current electrode which is connected to said second voltage source and a second current electrode which is connected to said control electrode of said fourth transistor; and
- (g-5) fifth to eighth constant current sources connected to said second current electrodes of said ninth to twelfth transistors, respectively.

19. The amplifier circuit of claim 18, wherein
said buffer further comprises
- (g-6) a thirteenth transistor including a control electrode which is connected to said second current electrode of said fifth transistor, a first current electrode which is connected to said second current electrode of said ninth transistor through said fifth constant current source and a second current electrode which is connected to said control electrode of said ninth transistor;
- (g-7) a fourteenth transistor including a control electrode which is connected to said second current electrode of said sixth transistor, a first current electrode which is connected to said second current electrode of said tenth transistor through said sixth constant current source and a second current electrode which is connected to said control electrode of said tenth transistor;
- (g-8) a fifteenth transistor including a control electrode which is connected to said second current electrode of said seventh transistor, a first current electrode which is connected to said second current electrode of said eleventh transistor through said seventh constant current source and a second current electrode which is connected to said control electrode of said eleventh transistor; and
- (g-9) a sixteenth transistor including a control electrode which is connected to said second current electrode of said eighth transistor, a first current electrode which is connected to said second current electrode of said twelfth transistor through said eighth constant current source and a second current electrode which is connected to said control electrode of said twelfth transistor.

20. The amplifier circuit of claim 19, wherein
said ninth to twelfth transistors are of first conductive type and said thirteenth to sixteenth transistors are of second conductive type.

* * * * *